United States Patent
Markle et al.

(10) Patent No.: US 10,776,203 B1
(45) Date of Patent: *Sep. 15, 2020

(54) STORAGE SYSTEM WITH INTER-STRETCH TRANSCODING

(71) Applicant: Amazon Technologies, Inc., Seattle, WA (US)

(72) Inventors: Seth William Markle, Seattle, WA (US); Bryan James Donlan, Seattle, WA (US); Paul David Franklin, Seattle, WA (US); Colin Laird Lazier, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 153 days.

This patent is subject to a terminal disclaimer.

(21) Appl. No.: 16/020,847

(22) Filed: Jun. 27, 2018

(51) Int. Cl.
*G06F 3/00* (2006.01)
*G06F 11/10* (2006.01)
*G06F 3/06* (2006.01)
*H03M 13/15* (2006.01)

(52) U.S. Cl.
CPC .......... *G06F 11/1076* (2013.01); *G06F 3/067* (2013.01); *G06F 3/0619* (2013.01); *G06F 3/0631* (2013.01); *G06F 3/0635* (2013.01); *G06F 3/0638* (2013.01); *G06F 3/0689* (2013.01); *H03M 13/1515* (2013.01)

(58) Field of Classification Search
None
See application file for complete search history.

(56) References Cited

U.S. PATENT DOCUMENTS

2015/0169253 A1   6/2015   Donlan
2015/0169716 A1   6/2015   Franklin et al.

*Primary Examiner* — Midys Rojas
(74) *Attorney, Agent, or Firm* — Davis Wright Tremaine LLP

(57) ABSTRACT

A data storage service stores a dataset on a set of storage nodes in accordance with a first encoding. A set of shards constituting quorum, and one or more additional shards, are stored on the storage nodes. The data storage system determines to store the dataset according to a second encoding, in which the second encoding has fewer total shards. The data storage system reconfigures the storage of the dataset in accordance with the second encoding, such that the reconfigured storage comprises subsets of shards from the first encoding that were not re-encoded in forming the second encoding.

20 Claims, 11 Drawing Sheets

STORAGE SYSTEM WITH INTER-STRETCH TRANSCODING

CROSS-REFERENCE TO RELATED APPLICATION

This application incorporates by reference for all purposes the full disclosure of co-pending U.S. patent application Ser. No. 16/020,825, filed concurrently herewith, now U.S. Pat. No. 10,534,669, entitled "STORAGE SYSTEM WITH INTER-STRETCH TRANSCODING".

BACKGROUND

The use of network computing and network data storage systems has proliferated in recent years, particularly in distributed or virtualized computer systems where multiple computer systems may share in the performance of computing tasks. The resources for network computing and network data storage are often supplied by computing resource providers who leverage large-scale networks of computers, servers and storage devices to enable customers to host and execute a variety of applications and web services.

The proliferation of network computing and network data storage, as well as the attendant increase in the number of entities dependent on network computing and network data storage, have increased the importance of balancing data availability and data integrity on network computing and network data storage systems. For example, data archival systems and services may use various types of error correcting and error tolerance schemes to promote data integrity and data availability.

BRIEF DESCRIPTION OF THE DRAWINGS

Various techniques will be described with reference to the drawings, in which.

DETAILED DESCRIPTION

Figure 1:
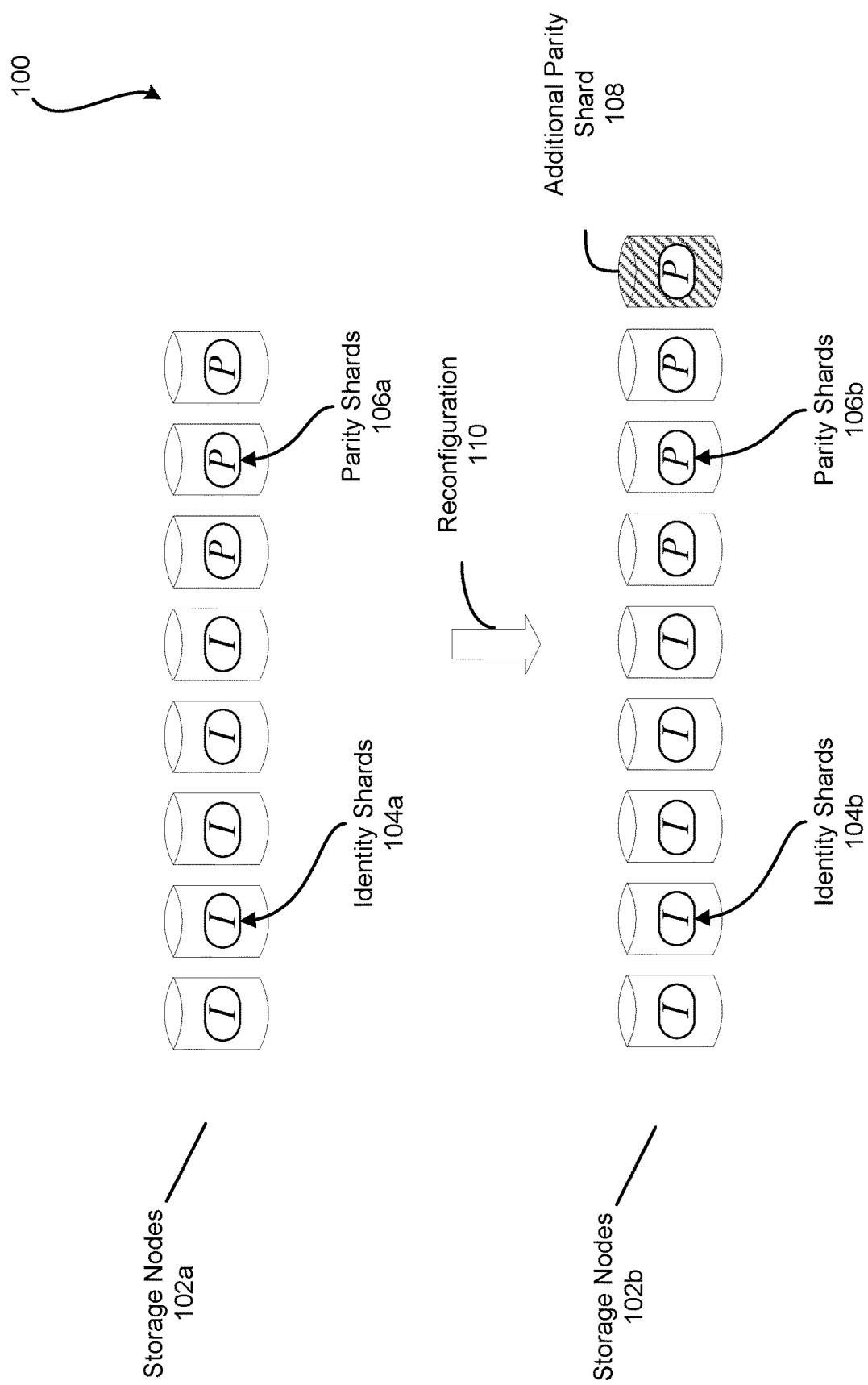
FIG. 1 illustrates an example of low-to-high stretch transcoding, in accordance with some embodiments.

Techniques described and suggested herein include systems, methods, and computer program products pertaining to the operation of a distributed data storage system. Specifically, the described techniques relate to transcoding redundantly encoded data stored by a distributed data storage system. The described techniques enable efficient transcoding from an encoding with a relatively high stretch factor to one with a relatively low stretch factor, or from an encoding with a relatively low stretch factor to an encoding with a relatively high stretch factor.

Redundancy encoding techniques, which may also be referred to as erasure encoding techniques, may be applied to data archives of a computing resource service provider to increase, for example, availability, redundancy, and durability while minimizing the number of extra storage volume required. Examples of such techniques include Reed-Solomon, Cauchy Reed-Solomon, fountain codes, regenerating codes, Raptor codes, MDS codes, and LT codes.

Associated with encodings are various properties and characteristics, including but not limited to a degree of resiliency to data loss, storage performance, encoding performance, retrieval performance, and decoding performance. The extent to which a given encoding is suitable for an application may depend on the particular requirements of that application, as well as on the particular circumstances in which the application is used. Moreover, the circumstances and applications of a particular data set may evolve over time, or change suddenly. Consequently, an encoding which was once well-suited may at some point cease being the most suitable encoding.

In redundancy encoding techniques, the stretch factor is a measure of the number of storage volumes required store a volume's worth of data. Encodings with relatively high stretch factors typically provide high degrees of resiliency to data loss, at the expense of being less space-efficient. Encodings with relatively low stretch factors, on the other hand, are less resilient but are more space efficient. Note that in some circumstances, properties such as resiliency to data loss or performance may be adjusted without alterations to the stretch factor. For example, doubling the number of identity and parity shards would not change the stretch factor, since the ratio between identity and parity shards would remain constant, but would increase the resiliency of the encoded data to data loss. The techniques described herein, except where explicitly noted, are applicable both to re-encodings that affect the stretch factor, as well as to re-encodings that do not affect the stretch factor.

A collection of data, which may also be referred to herein as "datasets," "data archives," "data objects," or more simply as "data," may be received from clients of a computing resource service provider for storage using a distributed storage service. Datasets may be received from an archival storage service. Datasets may also be received from other services provided by the computing resource service provider including, but not limited to, redundant storage services, block storage services, virtual machine services, or other such services.

Using a redundancy encoding technique, datasets stored by a distributed storage service may be grouped into a collection of shards where each shard represents a logical distribution of the data items. A shard, as used herein, is a logical representation of a dataset stored in a distributed data storage service. In particular, as used herein, a shard refers to a portion of an encoding of a dataset. For example, in an embodiment, an encoding, or simply a coding, is applied to a dataset to produce a set of shards which logically represents the dataset. In an embodiment, an erasure encoding or redundancy encoding is applied to the dataset, producing a set of identity shards and a set of parity shards.

An identity shard is representative of a portion of the original data. For example, in an embodiment, if a dataset is divided into k identity shards, each identity shard is a verbatim copy of a portion of the original dataset. The dataset may be reconstructed based on a recombination of the k identity shards.

A parity shard is an encoded representation of a portion of the original data. For example, in an embodiment, the parity shard is generated via bitwise arithmetic on one or more of the identity shards. In the event of a failure, the original data may be reconstructed using the remaining parity shards and/or identity shards. The original data can be reconstructed if at least k shards remain, in any combination of identity shards and/or parity shards.

Identity shards are one example of what may be referred to as a quorum shard. As used herein, the term quorum shard refers to a member of a group of shards that, collectively, may be used to reconstruct the original dataset. In the case of Reed-Solomon encoding, for example, the set of identity shards may be referred to as the set of quorum shards. In another example, a set of quorum shards may comprise k of the encodings shards, where k in this example is the minimum number of shards predicted to be usable to reconstruct the original dataset. This could, for example, occur in fountain coding where any k nodes of an erasure-coded dataset are statistically likely to be usable to reconstruct the dataset.

In various embodiments, a shard may comprise a number of sub-shards. The sub-shards may comprise un-encoded portions of the original dataset, or encoded data generated using erasure coding with an enlarged encoding matrix. By pre-selecting ratios of shards between an original and a subsequent encoding, at least some of the sub-shards may be preserved in the transcoding. Moreover, it may be possible to generate new shards based on access to a limited subset of other shards. Accordingly, the re-encoding is more efficient than with other techniques.

In an embodiment, each shard is stored on an associated data storage device and/or an associated data storage volume. A collection of shards may include one or more identity shards, which may also be referred to as data shards, and one or more parity shards, which may also be referred to as derived shards.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

As one skilled in the art will appreciate in light of this disclosure, certain embodiments may be capable of achieving certain advantages, including some or all of the following. In an embodiment, a data storage system is made more adaptable to changing requirements, for example by permitting convenient switching to an encoding which conforms to a current set of storage requirements. In another embodiment, the efficiency of the data storage system is improved by permitting switching to an encoding with better performance characteristics for a given usage pattern or desired resiliency level.

FIG. 1 illustrates an example of low-to-high stretch transcoding, in accordance with some embodiments. In the example 100, a dataset is encoded on a set of storage nodes 102a as a set of identity shards 104a and a set of parity shards 106a. In the example 100 of FIG. 1, each of the storage nodes 102a stores either an identity shard 104a or a parity shard 106a. The storage nodes 102 can comprise a variety of devices including, but not limited to, tape drives, tapes, disk drives (including both solid state drives and spinning drives), removable media, computer memory, flash drives, various magnetic media, and/or other such storage devices. Each dataset may be stored on one or more of the storage nodes 102, which can include both homogenous and heterogeneous collections of data storage devices such as, for example, arrays of solid-state memories, sets of mechanical disk drives, sets of tape drives, or various hybrid storage devices.

In an embodiment, a reconfiguration process 110 transcodes the dataset from the initial encoding of 5:8, to a subsequent encoding of 5:9. The stretch of the encoding thus increases from 1.6 (8/5) to 1.8 (9/5). The stretch factor of an encoding, which in an embodiment is defined as the ratio of the total number of shards to the number of identity shards, is indicative of how space efficient an encoding is, with a stretch factor of 1 indicating that the encoding is full efficient. Higher stretch factors, on the other hand, are indicative of greater resiliency to data loss.

In the example of FIG. 1, the second encoding is selected based on the first encoding, such that the value of k remains constant between the two encodings. It will be appreciated that this example is intended to be illustrative, and therefore should not be construed so as to limit the scope of the present disclosure to only the specific example provided.

The fixing of k between the initial and subsequent encodings, i.e. keeping k constant, affects the reconfiguration process 110 by permitting the identity shards 104a of the initial encoding to be efficiently incorporated into the subsequent encoding. In the subsequent encoding, the identity shards 104b are the same identity shards 104a of the original encoding. In an embodiment, the identity shards 104 are not copied between storage nodes during the reconfiguration process 110, but rather are left in place and the same identity nodes are used in both the initial and subsequent configurations.

The parity shards 106a of the initial encoding are re-encoded as a new set of parity shards 106b that incorporate the additional parity shard 108. Note that in the example of FIG. 1, a single additional parity shard 108 is added. However, in cases and embodiments, the number of additional shards added and incorporated in to the parity shards 106b depends on the target encoding.

In an embodiment, one or more of the parity shards 106a are left in place on their corresponding parity nodes during the reconfiguration process 110, and the additional shard parity 108 is encoded and stored on an additional storage node.

In another embodiment, one or more of the parity shards 106a in the initial configuration are re-encoded according to the new encoding, and stored on one of the available storage nodes 102b.

In an embodiment, the additional parity shard is generated and added to a corresponding additional storage node. In an embodiment, the additional storage node is obtained by withdrawing the node from a pool of nodes reserved for supporting transcoding. In another embodiment, the additional storage node is provisioned from elsewhere and configured to serve as a storage node.

In an embodiment, the additional parity shard 108 is generated based at least in part on encoding data from one or more of the identity shards.

In an embodiment, the additional parity shard is generated based at least in part on one or more of the parity shards 106a from the initial configuration. In some instances, data for the additional parity shard 108 is copied from another parity shard. In other instances, data for the additional parity shard 108 is encoded based on one or more of the parity shards 106a from the initial configuration.

Figure 2:
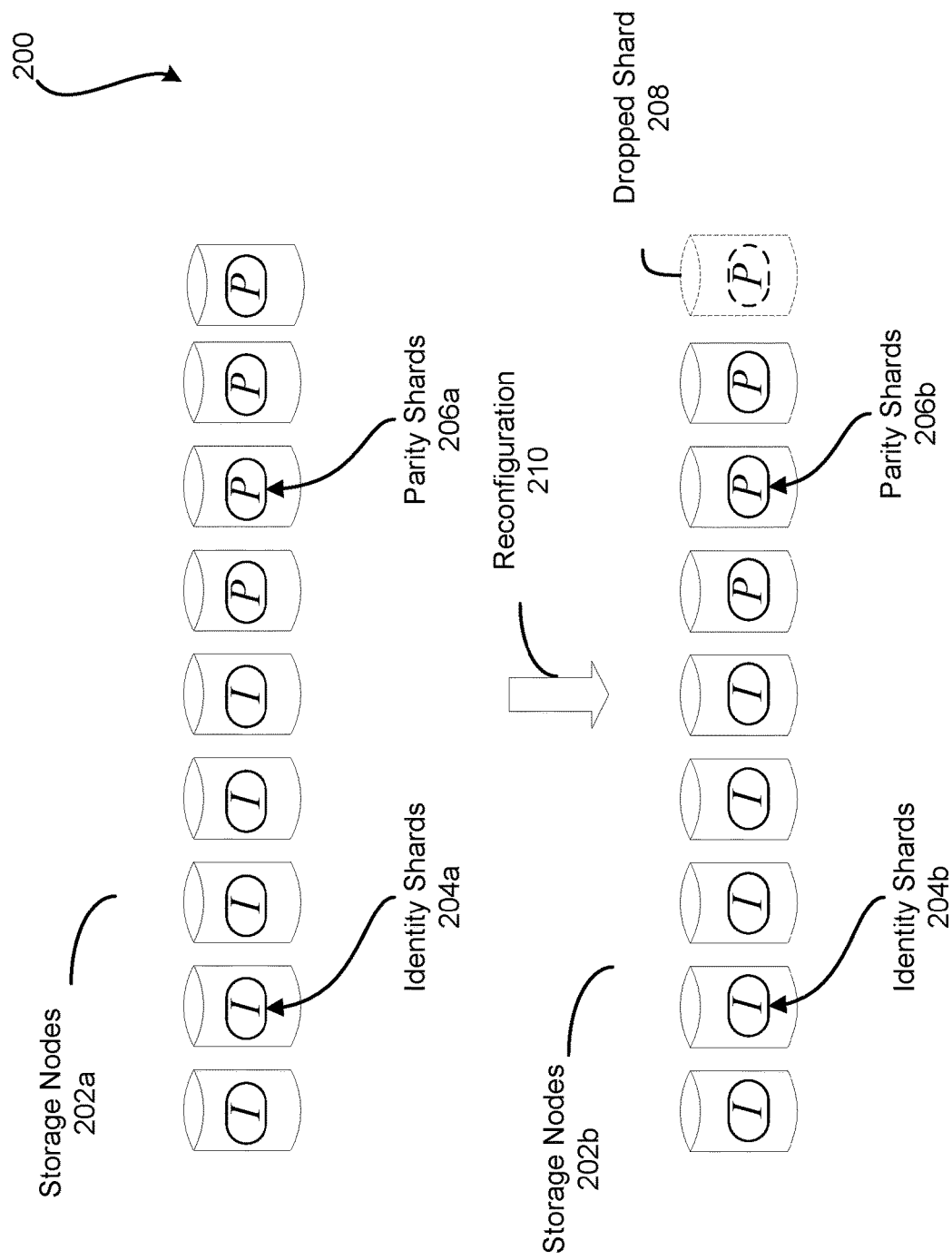
FIG. 2 illustrates an example of high-to-low stretch transcoding, in accordance with some embodiments.

A dataset encoded on a set of storage nodes may be transcoded from a higher-stretch encoding to a lower-stretch encoding. FIG. 2 illustrates an example of high-to-low stretch transcoding, in accordance with some embodiments.

In the example 200 of FIG. 2, a dataset is encoded on a set of storage nodes 202a as a set of identity shards 204a and a set of parity shards 206a. In the example 200, each of the storage nodes 202a stores either an identity shard 204a or a parity shard 206a. These may be transcodes to a corresponding, and typically overlapping, set of storage nodes 202b.

In an embodiment, a reconfiguration process 210 transcodes the dataset from the initial encoding of 5:9, to a subsequent encoding of 5:8. The stretch of the encoding thus decreases from 1.8 (9/5) initially to 1.6 (8/5) subsequently. It will be appreciated that this example is intended to be illustrative, and therefore should not be construed so as to limit the scope of the present disclosure to only the specific example provided.

The subsequent encoding is selected to have the value of k remain constant between the two encodings. Keeping k constant between the initial and subsequent configurations affects the reconfiguration process 210 by permitting the identity shards 204a of the initial encoding to be efficiently incorporated into the subsequent encoding. The identity shards 204b in the subsequent encoding are the same identity shards 204a of the initial encoding. In an embodiment, the identity shards 204 are not copied between storage nodes during the reconfiguration process 210, but rather are left in place and the same identity nodes are used in both the initial and subsequent configurations.

In an embodiment, extra shards in the de-stretched encoding are dropped or deleted. In FIG. 2 this is illustrated by the indication of a dropped shard 208 in the subsequent encoding. In some instances, an extra shard is simply dropped. In other instances, information in the extra shard is used in re-encoding the remaining parity shards, and then dropped.

In an embodiment, the remaining parity shards 206b are retained in the subsequent configuration. In an embodiment, the remaining parity shards 206 are not copied between storage nodes during the reconfiguration process 210, but instead are left in place without copying or re-encoding. However, in some cases and embodiments, the remaining parity shards 206b are re-encoded during the reconfiguration process 210. In an embodiment, the re-encoding of the parity shards 206a into the reduced set of parity shards 206b in the subsequent configuration is based on information in the identity shards. In another embodiment, the re-encoding of the parity shards 206a into the reduced set of parity shards 206b is based on the parity shards. In another embodiment, a combination of both the identity and parity shards is used during the reconfiguration process 210.

Figure 3:
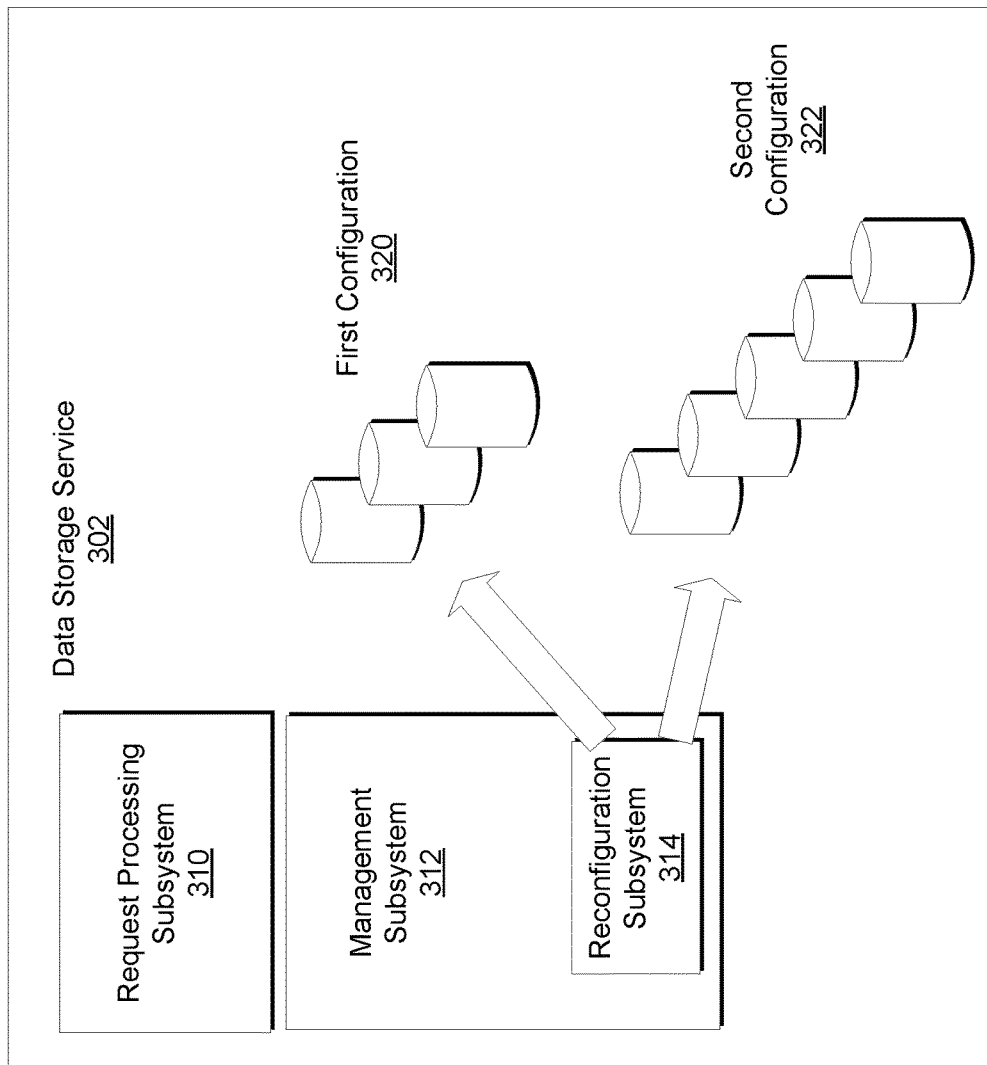
FIG. 3 illustrates an example of a data storage service capable of providing inter-stretch transcoding, in accordance with some embodiments.
Figure 3:
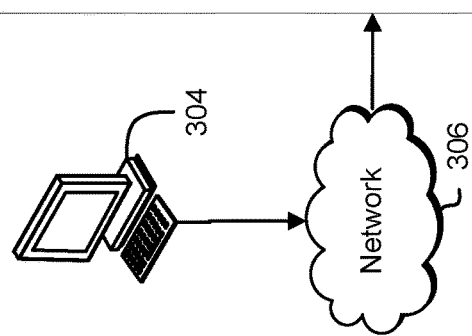

The techniques described in FIGS. 1 and 2 may be practiced in association with a data storage service. FIG. 3 illustrates an example of a data storage service 302 with inter-stretch transcoding, in accordance with some embodiments.

In the example 300 of FIG. 3, a client device 304 communicates via a network 306 with a data storage service 302. The network 306 may be any of various network types, such as the Internet or an intranet, wireless network, cellular network, and so forth, in various combinations.

In an embodiment, the client device 304 sends data storage and retrieval requests to the data storage service 302. A data storage request typically comprises the data whose storage is requested, and a key or other identifier enabling the stored data to be retrieved at a later time. A data retrieval request typically comprises the key or other identifier, to indicate what data should be retrieved. Requests to store data are processed by the request processing subsystem 310. In an embodiment, the request processing subsystem 310 is a collection of computing resources, such as webservers and application servers, collectively configured to process requests submitted to the data storage service. The request processing subsystem is described in more detail below, in reference to FIG. 8.

In an embodiment, the data storage service provides capabilities for automatically or easily switching, on behalf of a client, from a lower-stretch encoding to a higher-stretch encoding. A higher-stretch encoding decreases storage capacity, but provides benefits which may, in various embodiments, include greater resiliency and increased performance in some circumstances.

In an embodiment, a management subsystem 312 responds to a request to reconfigure shards of a dataset from an initial configuration 320 to a subsequent configuration 322. In some instances, the request is sent over the network 306 to the management subsystem 312 of the data storage service 302. A reconfiguration subsystem 314, which may itself be a subsystem of the management subsystem 312, coordinates the process of switching the configuration of storage nodes and corresponding shards. The reconfiguration coordinated by the reconfiguration subsystem 314 proceeds, in an embodiment, in accordance with the procedure described in relation to FIG. 1.

In an embodiment, the data storage service 302 determines to switch from a lower-stretch encoding to a higher-stretch encoding independently of a client device 304 request.

In an embodiment, the determination is based on factors such as performance, observed or predicted failure rates, indications of changed client sensitivity to data loss, and so forth.

In an embodiment, the data storage service provides capabilities for automatically or easily switching, on behalf of a client, from higher-stretch encoding to lower-stretch encoding. A lower-stretch encoding reduces resiliency and may reduce performance in some circumstances, but also improves storage efficiency. As such, the cost incurred operating the data storage service 302 on behalf of the client device 304 is reduced.

In an embodiment, the management subsystem 312 responds to a request from the client device 304 to reconfigure the shards of a dataset from a configuration with a high-stretch encoding 322 to a configuration with a low-stretch encoding 320.

In an embodiment, the data storage service 302 determines to switch to the lower-stretch encoding 320 independently of a client request. In an embodiment, the management subsystem 312 determines to switch encodings based on factors such as performance, observed or predicted failure rates, and indications of changed client sensitivity to data loss.

In an embodiment, the management subsystem 312 coordinates with the reconfiguration subsystem 314 to conduct the reconfiguration. For example, in an embodiment, the reconfiguration subsystem 314 proceeds, in accordance with the process described with reference to FIG. 2, to reconfigure storage for a dataset from a high-stretch encoding to a low-stretch encoding.

Figure 4:
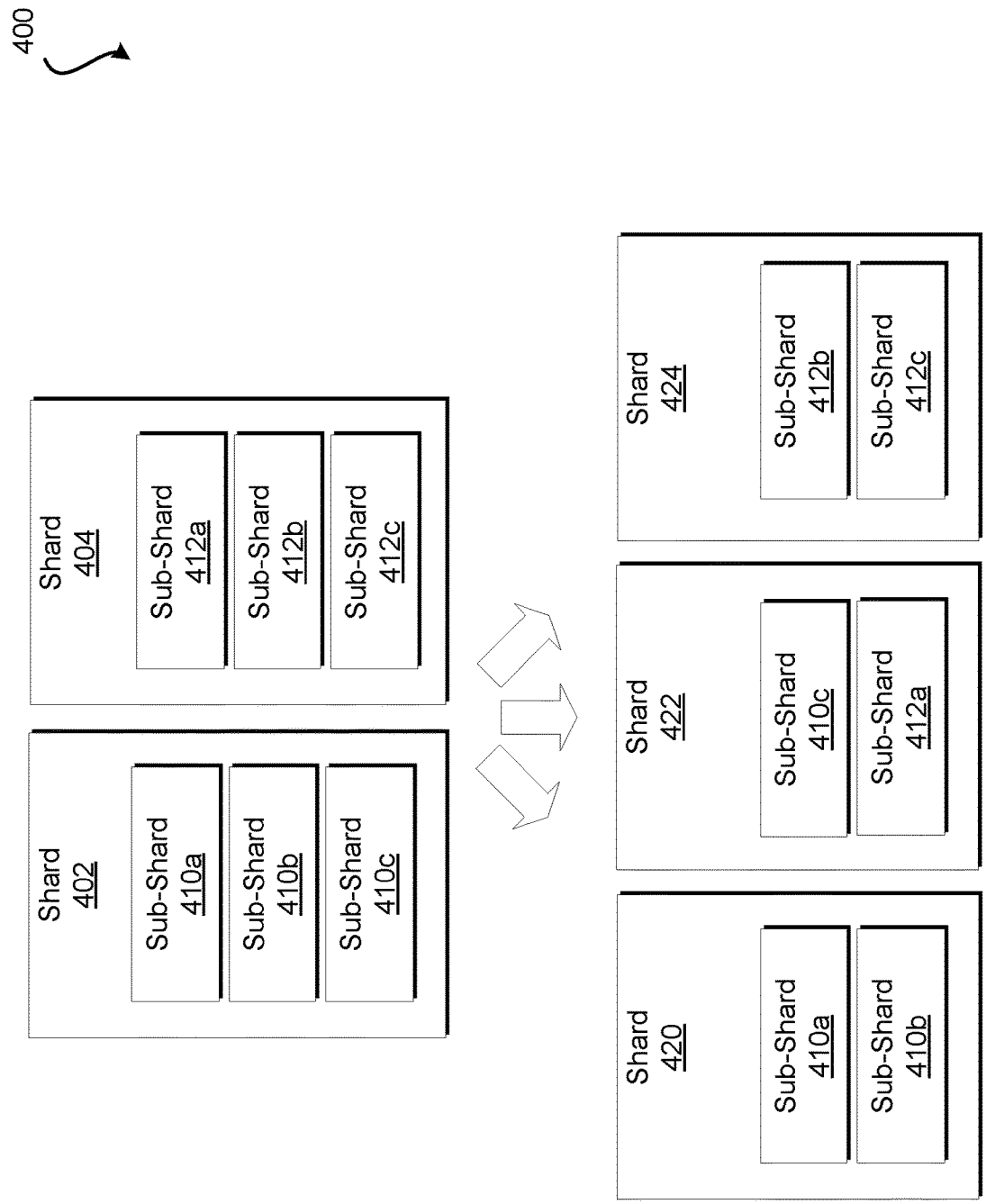
FIG. 4 illustrates an example of splitting and combining shards, in accordance with some embodiments.

FIG. 4 illustrates an example of splitting and combining shards, in accordance with some embodiments. In the example of FIG. 4, a first encoding comprises the two depicted shards 402, 404 and a number of additional shards. For clarity of illustration, the additional shards of the first encoding are not depicted by FIG. 4. Each of the two shards 402, 404 comprises a number of portions 410a-c, 412a-c. In a second encoding, these portions are reallocated between three shards 420, 422, 424. Note that the re-allocation does not require re-encoding. Instead, in an embodiment, selected portions of the existing shards 402, 404 are copied such that the new set of shards 402, 422, 424 are created without re-encoding and with a minimized amount of copying. For example, shard 420 can be created from shard 402 by moving one of the portions (which may be referred to as sub-shards) 410c to another shard 422.

The sub-shards 410, 412 may be generated by using an encoding technique in which the dataset is encoded using an enlarged encoding matrix. For example, in an embodiment, an enlarged encoding matrix is used to generate an encoding whose output is mapped at the sub-shard level. In an embodiment employing a Reed Solomon encoding, this may for example be accomplished using a Vandermonde matrix whose number of rows is based at least in part on a selected number of sub-shards.

Figure 5:
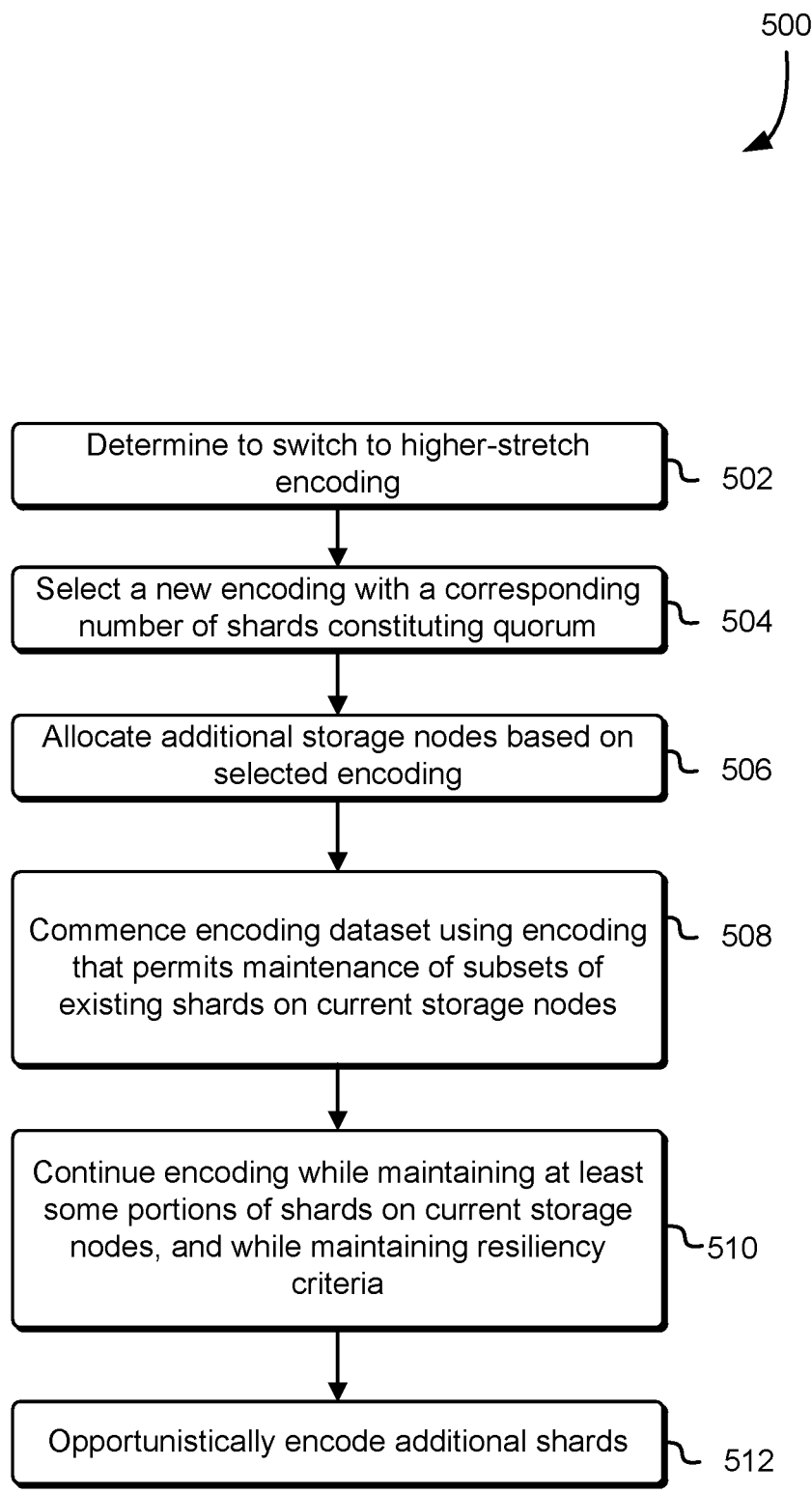
FIG. 5 illustrates an example process for transcoding from a lower-stretch encoding to a higher-stretch encoding, in accordance with some embodiments.

FIG. 5 illustrates an example process for transcoding from a lower-stretch encoding to a higher-stretch encoding, in accordance with some embodiments. Although FIG. 5 is depicted as a sequence of steps, the depicted sequence should not be construed as limiting the scope of the present disclosure to only those embodiments conforming to the depicted order. For example, unless otherwise indicated or clear from context (e.g., when the output of one step is used as input into another), the at least some of the depicted steps may be reordered or performed in parallel.

In an embodiment, the steps of the example process are performed by a data storage service to transcode a dataset from a lower-stretch encoding to a higher-stretch encoding. In this embodiment, the example process 500 comprises obtaining additional storage nodes, re-encoding the dataset using a higher-stretch encoding, and storing the resulting shards on the additional storage nodes. Note that, in some aspects, the transcoding or re-encoding process comprises copying subsets of existing shards without performing an encoding operation on the subset. As used herein, transcoding or re-encoding refers to the overall process, which may comprise operations which copy without encoding, and operations which involve encoding calculations. Additional aspects of these and other steps of the process 500 are explained below.

At step 502, the data storage service determines to switch to a higher-stretch encoding. In an embodiment, the determination is made by the data storage service in response to a request from a client. For example, a client of the data storage service may explicitly request the switch between encodings. Alternatively, the client may provide an indication that a switch between encodings would be advisable. These indications might include specifications of a desired resiliency level, cost parameters, latency requirements, and so forth. In another embodiment, the determination is made automatically by the data storage service, based on these and other similar factors.

At step 504, the data storage service selects a new encoding whose k value, i.e. the number of shards that constitutes quorum, corresponds to the prior encoding. In some embodiments, the k values are fixed at a ratio of 1:1, which may permit identity shards, or subsets thereof, to be retained in their original form in the new encoding. In another embodiment, k is larger in the new encoding, and is set based on an intent to re-combining sub-shards on a larger number of storage nodes. For example, if k were originally 2 and each of the two shards comprised three sub-shards, a new k value of 3 might be selected based on an intent to copy one sub-shard from each of the two existing shards to the new third shard. In the reconfigured system, each of the three shards would then comprise two sub-shards.

In other embodiments, the ratio of k values is based on replication of the identity shards in the original encoding. For example, an identity shard $I_1$ might be replicated to $I_1$ and $I_{1R}$ in the new encoding, where $I_{1R}$ is a replica of $I_1$. Similarly, the ratio might reflect splitting of the identity shards. For example, the identity shard $I_1$ might be split into $I_{1a}$ and $I_{1b}$ in the new encoding. Here, $I_{1a}$ represents the original $I_1$ identity shard, minus a portion of data from the original $I_1$ identity shard that has been split into $I_{1b}$. In still other embodiments, portions of the original identity shards are combined to form new identity shards. For example, identity shards $I_1$ and $I_2$ might be split during re-encoding to form $I_{1a}$, $I_{2a}$, and $I_{1a2b}$. Here, $I_{1a}$ is the original identity shard $I_1$, minus a portion of data that has been moved into $I_{1a2b}$. Likewise, $I_{2a}$ is the original identity shard $I_2$, minus a portion of its data also contributed to $I_{1a2b}$. Note that in each of the aforementioned embodiments, at least a portion of data from each of the original k identity shards is retained in its original storage location, without re-encoding.

In an embodiment, the new encoding is selected to have an increased number of shards not necessary for quorum, e.g. an increased number of parity shards, than the prior encoding. For example, in an embodiment, the data storage service provides a capability for switching between two encodings, each of which has the same number of identity shards but different number of parity shards. For example, the first might be a 5:8 encoding and the second a 5:12. The first encoding might therefore have three parity shards, while the second has seven.

At step 506, the data storage service allocates additional storage nodes based on the selected encoding. For example, in an embodiment, the data storage service is switching from an encoding with 8 shards to an encoding with 12 shards, and therefore allocates 4 additional storage nodes on which the new parity shards can be stored.

At step 508, the data storage service commences the encoding of the dataset using an encoding that permits maintenance of at least some portions of existing shards on the current storage nodes. For example, in an embodiment employing Reed Solomon encoding, the storage nodes on which the existing identity shards are stored are kept in the subsequent configuration, and the identity shards stored on each node are not copied.

At step 510, the data storage service continues re-encoding, while retaining at least some portions of the shards in the new configuration. For example, in an embodiment, the parity shards which existed prior to the reconfiguration are left on their respective storage nodes, without being moved to another storage node or re-encoded. In another embodiment, portions of a shard are moved, without re-encoding, to another storage node and combined with another shard. These operations may further be performed while maintaining compliance to resiliency criteria.

At step 512, the data storage service opportunistically encodes the additional shards added by the reconfiguration. For example, in an embodiment, a new shard is constructed in response to read operations involving a portion from which the new shard is to be constructed. The system may, for example, process a read operation accessing a sub-shard on an existing node, and also copy that sub-shard to its destination on the new shard. In another embodiment, data for a parity shard is encoded in response to a read access to a shard associated with the encoding. For example, if a parity shard $P_{new}$ is to be calculated based on $I_1$ and $I_2$, the data for $P_{new}$ can be calculated in response to a read access to either $I_1$ or $I_2$.

Figure 6:
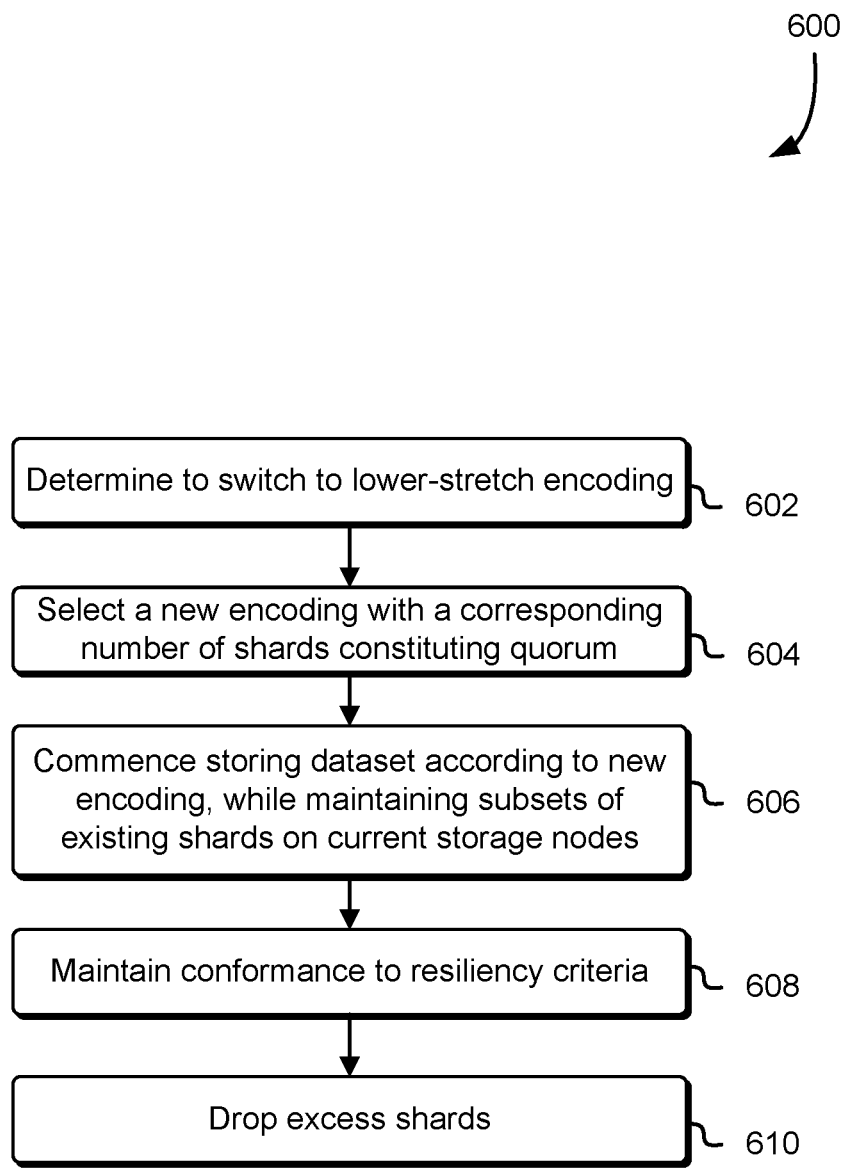
FIG. 6 illustrates an example process for transcoding from a higher-stretch encoding to a lower-stretch encoding, in accordance with some embodiments.

FIG. 6 illustrates an example process for transcoding from a higher-stretch encoding to a lower-stretch encoding, in accordance with some embodiments. Although FIG. 6 is depicted as a sequence of steps, the depicted sequence should not be construed as limiting the scope of the present disclosure to only those embodiments conforming to the depicted order. For example, unless otherwise indicated or clear from context (e.g., when the output of one step is used as input into another), the at least some of the depicted steps may be reordered or performed in parallel.

In an embodiment, the steps of the example process are performed by a data storage service to transcode a dataset from a higher-stretch encoding to a lower-stretch encoding. In an embodiment, the example process 600 comprises reducing the number of shards constituting quorum, while permitting at least some portions of existing shards to remain stored in their original locations. Additional aspects of these and other steps of the process 600 are explained below.

In step 602, the data storage system determines to switch to a lower-stretch encoding, or in other words to an encoding whose ratio of k to n is lower. For example, transitioning from a 5:9 encoding to a 5:8 encoding would lower the stretch ratio from 1.8 to 1.6. In an embodiment, the determination is made by the data storage service in response to a request from a client. A client may, for example, request that the encoding be switched. Alternatively, the client may provide an indication that a switch between encodings would be advisable. These indications might include information pertaining to resiliency levels, cost parameters, latency requirements, and so forth. In another embodiment, the determination is made automatically by the data storage service, based on these and other similar factors.

In step 604, the data storage system selects a new encoding with a corresponding number of shards constituting quorum. Thus, the k value for the new encoding, i.e. the number of shards needed to reconstruct the dataset, is proportional to the k value of the prior encoding. In some embodiments, the ratio of k values in the original and new encoding is 1:1. In other embodiments, the ratio of k values corresponds to a combination of shards in the original encoding. For example, in an embodiment employing Reed Solomon, identity shards $I_1$ and $I_2$ in the original encoding might be combined to form identity shard $I_{12}$ in the new encoding. The k ratio in such cases would be 2:1. In other embodiments, data from an identity shard is combined into two or more other identity shards. For example, in the identity shards $I_1$, $I_2$, and $I_3$ might be reconfigured as $I_{1a3a}$ and $I_{2a3b}$. Here, X is the original identity shard $I_1$ plus a portion of the data from $I_3$. Likewise, X is the original identity shard $I_2$ plus another portion of the data from $I_3$. Note that in each of these cases, at least a portion of data from each of the k identity shards is retained in its original storage location, without re-encoding. Also note that the prior example might also be applied to encodings which do not have identity shards. For example, in some encoding schemes any k of the shards constitutes a quorum number of shards. In an embodiment, the ratio of k values is selected to either maintain a 1:1 ratio, or based on combining existing shards such that k is reduced in the new encoding. For example, where k=3 in the original encoding, k might be 2 in the new encoding based on an intent to move the sub-shards from one of the three original shards to the two remaining shards in the new encoding.

In an embodiment, the new encoding is selected to have a decreased number of parity shards relative to the prior encoding. For example, in an embodiment, the data storage service provides a capability for switching between two encodings, each of which has the same number of identity shards but different number of parity shards. For example, the first might be a 5:12 encoding and the second a 5:8, encoding. The first encoding might therefore have seven parity shards, while the second has three.

In step 606, the data storage system commences re-encoding the dataset for the new configuration, using an encoding that permits maintenance of existing portions of the shards on their current respective storage nodes. In an embodiment, the dataset may be stored by the data storage system in accordance with the new encoding without modifying any of the original shards. These shards may therefore be left in place in the new encoding. In another embodiment, portions of shards are moved to other storage nodes and combined with other sub-shards to form new shards, each of which comprises more data than they did prior to the re-encoding.

In step 608, the data storage system continues re-encoding, while retaining existing portions shards in the new configuration. In an embodiment, the new encoding is such that the existing parity shards do not need to be recomputed, and are therefore left in place without needing to be recomputed. In another aspect, portions of some shards may be moved to other storage nodes and combined with other shards.

In step 610, the data storage system drops excess shards. As explained regarding steps 602 and 604, the new encoding has fewer shards than the original encoding. In some instances, these excess shards may be simply dropped. In an embodiment, for example, excess shards are dropped and their corresponding storage nodes are returned to a pool of storage nodes.

Figure 7:
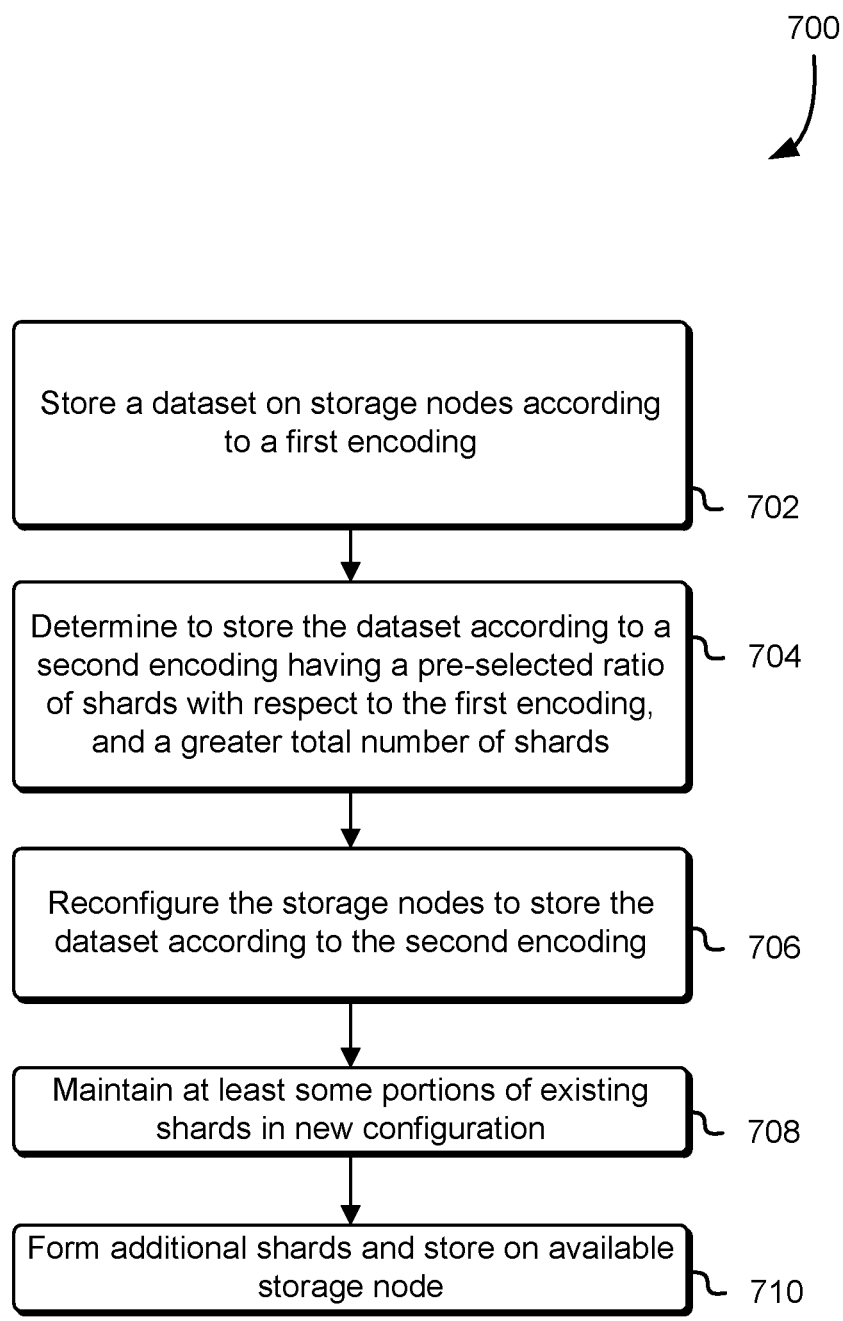
FIG. 7 illustrates an example process for reconfiguring a storage system to a higher-stretch encoding, in accordance with some embodiments.

FIG. 7 illustrates an example process for reconfiguring a storage system to a higher-stretch encoding, in accordance with some embodiments. Although depicted as a sequence of steps, the depicted sequence should not be construed as limiting the scope of the present disclosure to only those embodiments conforming to the depicted order. For example, unless otherwise indicated or clear from context (e.g., when the output of one step is used as input into another), the at least some of the depicted steps may be reordered or performed in parallel.

In an embodiment, the steps of the example process 700 are performed by a data storage service to transcode a dataset from a first encoding, with a relatively low stretch factor, to a second encoding with a relatively high stretch factor. Additional aspects of the example process 700 are explained below.

In step 702, the data storage service stores a dataset on storage nodes in accordance with a first encoding of the dataset. In an embodiment, the data storage service encodes the dataset with k identity shards and m parity shards. The set of k identity shards is stored on a corresponding set of k storage nodes. The set of m parity shards is stored on a corresponding set of m storage nodes. More generally, the data storage service encodes the dataset with k shards necessary to reconstruct the original dataset, and m additional shards, and stores the k and m shards on k+m storage nodes.

In step 704, the data storage service determines to store the dataset according to a second encoding, in which the second encoding has a greater number of shards in relation to the first encoding. For example, both encodings may have the same number of identity shards, or the new encoding may be selected so that a larger number of shards may be generated while permitting at least some portions of the existing shards to remain in place.

The second encoding is selected based on it having a greater number of shards than the first encoding. As described herein, the use of a greater number of shards increases the stretch factor of the encoding. This may, for example, improve the resiliency of the system to data loss.

In an embodiment, the determination to switch to a second encoding is based on a client request. In another embodiment, the determination to switch to the second encoding is based on information indicative of updated criteria for storing the dataset. For example, in an embodiment, the data storage service receives information indicating that there has been a change in the client's criteria for storing the dataset. For instance, the client may indicate that the particular dataset needs to be stored with an increased level of resiliency than previously. Alternatively, various performance criteria may be specified.

In step 706, the data storage system reconfigures its storage nodes to store the dataset according to the second encoding. In an embodiment, this step comprises obtaining, reserving, allocating, or adding additional storage nodes to accommodate the additional shards, and then commencing a process whereby the additional shards will eventually be stored on the additional storage nodes. In some cases, such as when formed from un-encoded sub-shards, an additional shard may be generated by operations which involve copying the sub-shards, without an encoding calculation. In other cases, an additional shard may be generated based on encoding.

In step 708, as a part of the reconfiguration, the data storage system maintains existing portions of shards in the new configuration. In an embodiment, the ratio of identity shards in the first and second configurations is the same, and each of the k identity shards remains in place on its respective one of the original k storage nodes both before and after the reconfiguration.

In another embodiment, portions of shards are split off and moved to other shards, in order to form an enlarged number of shards. An example of this process is illustrated in FIG. 4.

In step 710, an additional shard is formed and added to an available storage node. For example, in an embodiment sub-shards are copied from existing shards in the original configuration to an additional shard in the new configuration. In another embodiment, an additional shard is generated based on encoding original data. The storing and/or encoding may, in an embodiment, be done lazily or opportunistically. For example, in an embodiment the data storage service waits to encode and store the shard until a request to access data is received, and the request pertains to a storage node on which the encoding of the additional shard relies. Note that, in an embodiment, pre-existing parity shards are maintained in place while the additional shards are lazily or opportunistically encoded. Because the pre-existing shards are maintained, the system retains at least the prior level of resiliency against data loss while the reconfiguration is underway.

Figure 8:
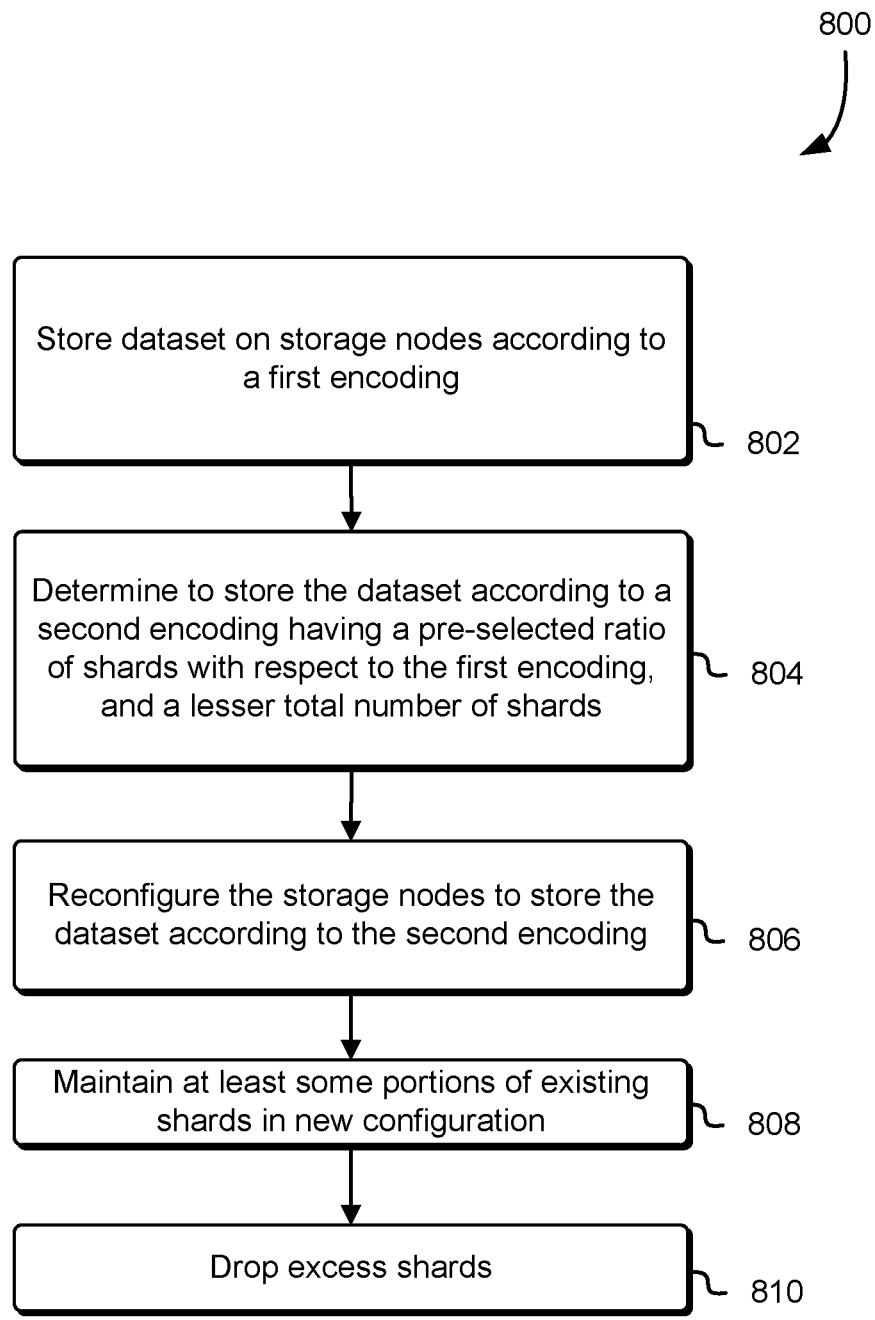
FIG. 8 illustrates an example process for reconfiguring a storage system to a lower-stretch encoding, in accordance with some embodiments.

FIG. 8 illustrates an example process for reconfiguring a data storage system to a lower-stretch encoding, in accordance with some embodiments. Although depicted as a sequence of steps, the depicted sequence should not be construed as limiting the scope of the present disclosure to only those embodiments conforming to the depicted order. For example, unless otherwise indicated or clear from context (e.g., when the output of one step is used as input into another), the at least some of the depicted steps may be reordered or performed in parallel.

In an embodiment, the steps of the example process 800 are performed by a data storage service to transcode a dataset from a first encoding to a second encoding with a lower stretch factor. Additional aspects of the example process 800 are explained below.

In step 802, the data storage service stores a dataset on storage nodes according to a first encoding. In an embodiment, the dataset is stored as at least k shards constituting quorum, and at least m additional shards, and stored on k+m storage nodes. In another embodiment, a dataset is encoded using Reed Solomon encoding as k identity shards and m parity shards and stored on corresponding sets of k storage nodes and m storage nodes.

In step 804, the data storage system determines to store the dataset on the storage nodes according to a second encoding, in which the second encoding has a pre-selected ratio of shards with respect to the first encoding, and a lesser total number of shards.

In an embodiment, the determination to switch to a second encoding is based on a client request. In another embodiment, the determination to switch to the second encoding is based on information indicative of changed criteria for storing the dataset. For example, in an embodiment, the data storage service receives information indicating that there has been a change in the client's criteria for storing the dataset. The client may, for example, indicate that the particular dataset no longer needs to be stored with a relatively high level of resiliency to data loss.

In step 806, the data storage service reconfigures the storage nodes to store the dataset according to the second encoding. In an embodiment, reconfiguration comprises re-routing data retrieval operations to conform to the second encoding. For example, in an embodiment the data storage and retrieval system reconfigures metadata to indicate the avoidance of parity shards, and corresponding storage nodes, no longer needed in the new configuration.

In step 808, at least some portions of the existing shards are maintained in the new configuration. For example, in an embodiment at least some sub-shards are copied, without re-encoding, to another shard whose existing sub-shards are retained in the new encoding.

In step 810, the excess parity shards are dropped. In an embodiment, the data storage service drops a parity shard by erasing it from the storage node on which it was stored. In an embodiment, the storage node or the corresponding space on the storage node is made available for other purposes, such as for storing data associated with another dataset.

Figure 9:
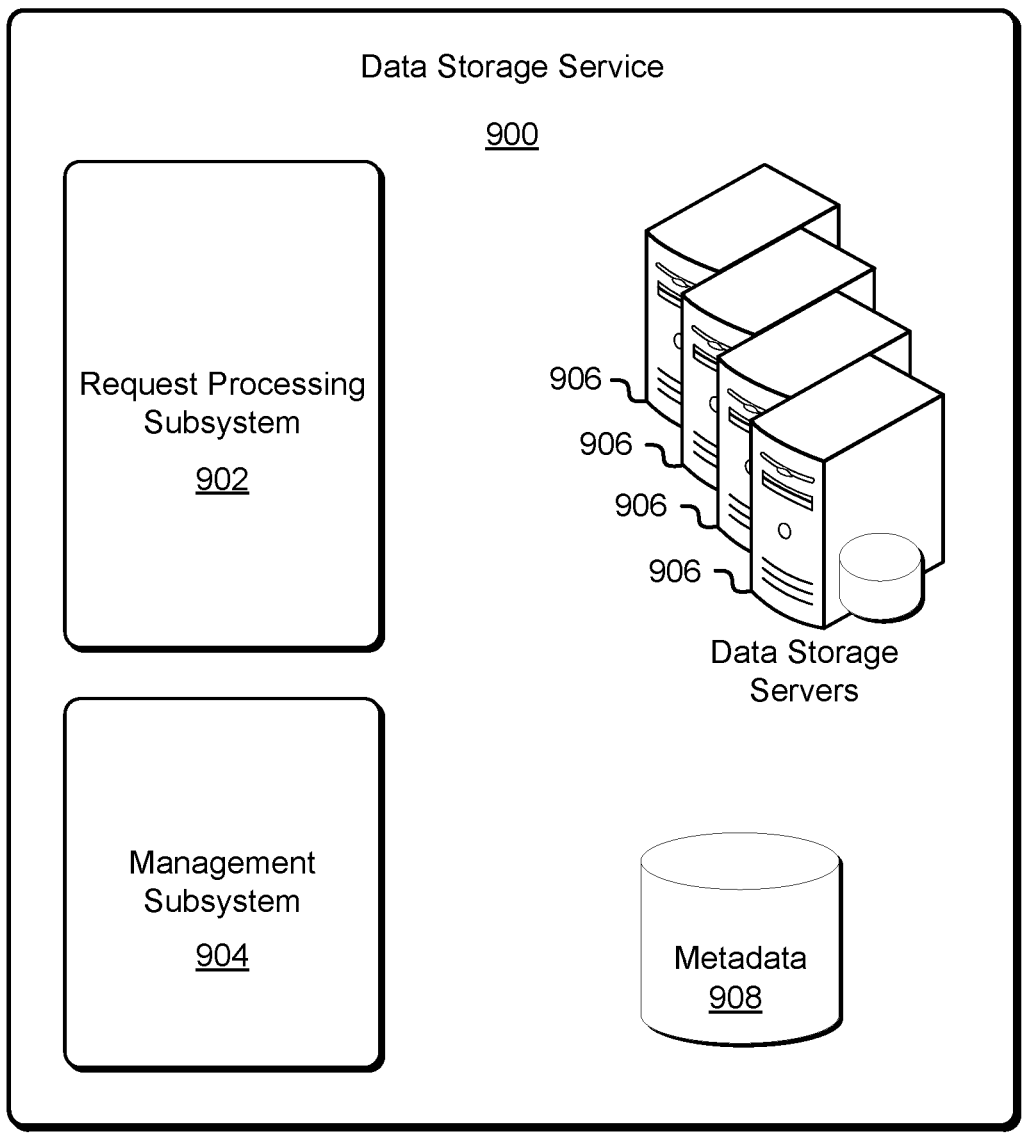
FIG. 9 illustrates an environment, including a computing resource service provider, in which data storage and indexing techniques may be implemented, in accordance with some embodiments.

FIG. 9 shows an illustrative example of a data storage service in accordance with various embodiments. The data storage service 900 may be a service of a computing resource provider used to operate an on-demand data storage service such as described below in connection with FIG. 10. As illustrated in FIG. 9, the data storage service 900 includes various subsystems such as a request processing subsystem 902 and a management subsystem 904. The data storage service 900 may also include a plurality of data storage servers 906 and a metadata storage 908, which may store metadata about various data objects stored among the data storage servers 906 as described. In an embodiment, the request processing subsystem 902 is a collection of computing resources, such as webservers and application servers, collectively configured to process requests submitted to the data storage service 900. The request processing subsystem 902, for example, may include one or more webservers that provide a web service interface to enable customers of the data storage service 900 to submit requests to be processed by the data storage service 900. The request processing subsystem 902 may include computers systems configured to make various determinations in connection with the processing of requests, such as whether policy allows fulfillment of a request, whether requests are authentic (e.g., electronically signed using a suitable cryptographic key) and otherwise.

Components of the request processing subsystem may interact with other components of the data storage service 900 (e.g., through network communications). For example, some requests submitted to the request processing subsystem 902 may involve the management of computing resources which may include data objects stored by the data storage servers 906. The request processing subsystem 902, for example, may receive and process requests to modify computing resources. For instance, in some examples, data objects are logically organized into logical data containers. Data objects associated with a logical data container may, for example, be said to be in the logical data container. Requests to the data processing subsystem 902 may include requests for creating logical data containers, deleting logical data containers, providing an inventory of a logical data container, providing or updating access control policy with respect to one or more logical data containers and the like.

The requests may be processed by the management subsystem 904 upon receipt by the request processing subsystem 902. If applicable, various requests processed by the request processing subsystem 902 and/or management subsystem 904, may result in the management subsystem 904 updating metadata associated with data objects and logical data containers stored in the metadata storage 908. Other requests that may be processed by the request processing subsystem 902 include requests to perform operations in connection with data objects. The requests, for example, may include requests to upload data objects to the data storage service 900, to download data objects from the data storage service 900, to delete data objects stored by the data storage service 900 and/or other operations that may be performed.

Requests processed by the request processing subsystem 902 that involve operations on data objects (upload, download, delete, e.g.) may include interaction between the request processing subsystem 902 and one or more data storage servers 906. The data storage servers 906 may be computer system communicatively coupled with one or more storage devices for the persistent of data objects. For example, in order to process a request to upload a data object, the request processing subsystem may transmit data to a data storage server 806 for persistent storage. It is noted, however, that in some embodiments, client (e.g., customer) computer systems may transmit data directly to the data storage servers 906 instead of through severs in the request processing subsystem.

In some embodiments, the request processing subsystem 902 transmits data to multiple data storage servers 906 for the purposes of redundantly storing the data to allow the retrievability of data in the event of failure of an individual data storage server 906 and/or associated data storage device. For example, in some embodiments, the request processing subsystem uses a redundancy in coding scheme such as erasure coding to deconstruct a data object into multiple parts that are stored among the data storage servers 906. The parts may be configured such that if access to a certain number of parts is lost, the data object may nevertheless be reconstructible from the remaining parts that remain accessible.

To enable efficient transfer of data between the request processing subsystem 902 and the data storage servers 906 and/or generally to enable quick processing of requests, the request processing subsystem 902 may include one or more databases that enable the location of data among the data storage servers 906. For example, the request processing subsystem 902 may operate a key value store that serves to associate identifiers of data objects with locations among the data storage servers 906 for accessing data of the data objects.

Figure 10:
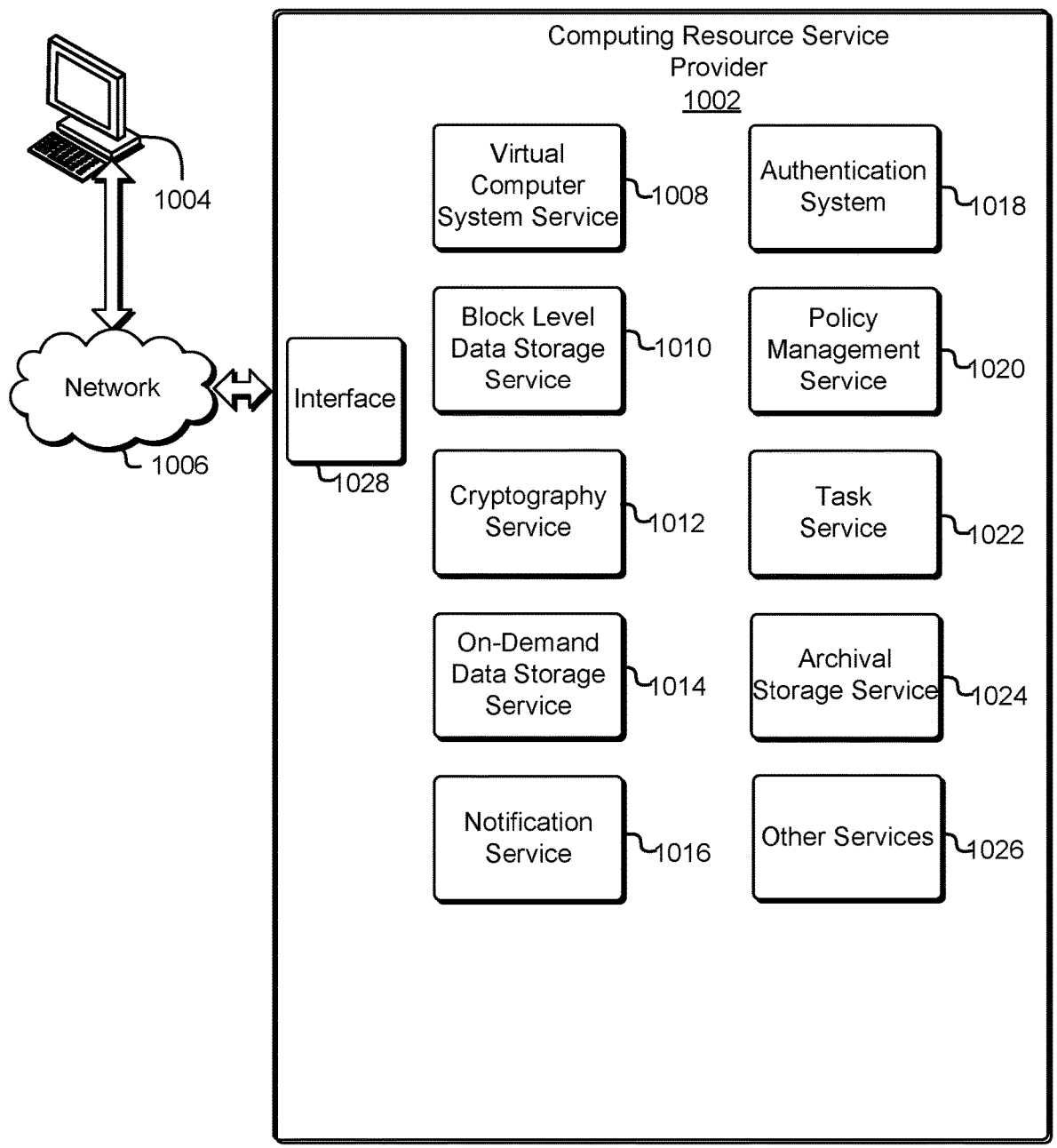
FIG. 10 illustrates a data storage service capable of implementing various data storage and indexing techniques, in accordance with some embodiments.

FIG. 10 shows an example of a client 1004 connected to a computing resource service provider 1002 in accordance with at least one embodiment. The computing resource service provider 1002 may provide a variety of services to the customer 1004 and the customer 1004 may communicate with the computing resource service provider 1002 via an interface 1028, which may be a web services interface or any other type of customer interface. While FIG. 10 shows one interface 1028 for the services of the computing resource service provider 1002, each service may have its own interface and, generally, subsets of the services may have corresponding interfaces in addition to or as an alternative to the interface 1028. The customer 1004 may be an organization that may utilize one or more of the services provided by the computing resource service provider 1002 to maintain and deliver information to its employees, which may be located in various geographical locations. Additionally, the customer 1004 may be an individual that utilizes the services of the computing resource service provider 1002 to deliver content to a working group located remotely. As shown in FIG. 10, the customer 1004 may communicate with the computing resource service provider 1002 through a network 1006, whereby the network 1006 may be a communication network, such as the Internet, an intranet or an Internet service provider (ISP) network. Some communications from the customer 1004 to the computing resource service provider 1002 may cause the computing resource service provider 1002 to operate in accordance with one or more embodiments described or a variation thereof.

The computing resource service provider 1002 may provide various computing resource services to its customers. The services provided by the computing resource service provider 1002, in this example, include a virtual computer system service 1008, a block-level data storage service 1010, a cryptography service 1012, an on-demand data storage service 1014, a notification service 1016, an authentication system 1018, a policy management service 1020, a task service 1022 and one or more other services 1026. It is noted that not all embodiments described include the services 1008-1024 described with reference to FIG. 10 and additional services may be provided in addition to or as an alternative to services explicitly described. As described, each of the services 1008-1024 may include one or more web service interfaces that enable the client 1004 to submit appropriately configured API calls to the various services through web service requests. In addition, each of the services may include one or more service interfaces that enable the services to access each other (e.g., to enable a virtual computer system of the virtual computer system service 1008 to store data in or retrieve data from the on-demand data storage service 1014 and/or to access one or more block-level data storage devices provided by the block-level data storage service 1010).

The virtual computer system service 1008 may be a collection of computing resources configured to instantiate virtual machine instances on behalf of the customer 1004. The customer 1004 may interact with the virtual computer system service 1008 (via appropriately configured and authenticated API calls) to provision and operate virtual computer systems that are instantiated on physical computing devices hosted and operated by the computing resource service provider 1002. The virtual computer systems may be used for various purposes, such as to operate as servers supporting a website, to operate business applications or, generally, to serve as computing power for the customer. Other applications for the virtual computer systems may be to support database applications, electronic commerce applications, business applications, and/or other applications. Although the virtual computer system service 1008 is shown in FIG. 10, any other computer system or computer system service may be utilized in the computing resource service provider 1002, such as a computer system or computer system service that does not employ virtualization or instantiation and instead provisions computing resources on dedicated or shared computers/servers and/or other physical devices.

The block-level data storage service 1010 may comprise one or more computing resources that collectively operate to store data for a customer 1004 using block-level storage devices (and/or virtualizations thereof). The block-level storage devices of the block-level data storage service 1010 may, for instance, be operationally attached to virtual computer systems provided by the virtual computer system service 1008 to serve as logical units (e.g., virtual drives) for the computer systems. A block-level storage device may enable the persistent storage of data used/generated by a corresponding virtual computer system where the virtual computer system service 1008 may only provide ephemeral data storage.

The computing resource service provider 1002 also includes a cryptography service 1012. The cryptography service 1012 may utilize one or more storage services of the computing resource service provider 1002 to store keys of the customers in encrypted form, whereby the keys may be usable to decrypt customer 1012 keys accessible only to particular devices of the cryptography service 1012.

The computing resource service provider 1002 further includes an on-demand data storage service 1014. The on-demand data storage service 1014 may be a collection of computing resources configured to synchronously process requests to store and/or access data. The on-demand data storage service 1014 may operate using computing resources (e.g., databases) that enable the on-demand data storage service 1014 to locate and retrieve data quickly, to allow data to be provided in responses to requests for the data. For example, the on-demand data storage service 1014 may maintain stored data in a manner such that, when a request for a data object is retrieved, the data object can be provided (or streaming of the data object can be initiated) in a response to the request. As noted, data stored in the on-demand data storage service 1014 may be organized into data objects. The data objects may have arbitrary sizes except, perhaps, for certain constraints on size. Thus, the on-demand data storage service 1014 may store numerous data objects of varying sizes. The on-demand data storage service 1014 may operate as a key value store that associates data objects with identifiers of the data objects that may be used by the customer 1004 to retrieve or perform other operations in connection with the data objects stored by the on-demand data storage service 1014.

In the environment illustrated in FIG. 10, a notification service 1016 is included. The notification service 1016 may comprise a collection of computing resources collectively configured to provide a web service or other interface and browser-based management console. The management console can be used to configure topics for which customers seek to receive notifications, configure applications (or people), subscribe clients to the topics, publish messages, or configure delivery of the messages over clients' protocol of choice (i.e., hypertext transfer protocol (HTTP), e-mail and short message service (SMS), among others). The notification service 1016 may provide notifications to clients using a "push" mechanism without the need to check periodically or "poll" for new information and updates. The notification service 1016 may further be used for various purposes such as monitoring applications executing in the virtual computer system service 1008, workflow systems, time-sensitive information updates, mobile applications, and many others.

As illustrated in FIG. 10, the computing resource service provider 1002, in various embodiments, includes an authentication system 1018 and a policy management service 1020. The authentication system 1018, in an embodiment, is a computer system (i.e., collection of computing resources) configured to perform operations involved in authentication of users of the customer. For instance, one of the services 1008-1016 and 1020-1024 may provide information from a user to the authentication system 1018 to receive information in return that indicates whether the user requests are authentic.

The policy management service 1020, in an embodiment, is a computer system configured to manage policies on behalf of customers (such as customer 1004) of the computing resource service provider 1002. The policy management service 1020 may include an interface that enables customers to submit requests related to the management of policy. Such requests may, for instance, be requests to add, delete, change, or otherwise modify policy for a customer or for other administrative actions, such as providing an inventory of existing policies and the like.

The computing resource service provider 1002, in various embodiments, is also equipped with a task service 1022. The task service 1022 is configured to receive a task package from the customer 1004 and enable executing tasks as dictated by the task package. The task service 1022 may be configured to use any resource of the computing resource service provider 1002, such as one or more instantiated virtual machines or virtual hosts, for executing the task. The task service 1022 may configure the one or more instantiated virtual machines or virtual hosts to operate using a selected operating system and/or a selected execution application in accordance with a requirement of the customer 1004.

The computing resource service provider 1002 additionally maintains one or more other services 1026 based at least in part on the needs of its customers 1004. For instance, the computing resource service provider 1002 may maintain a database service for its customers 1004. A database service may be a collection of computing resources that collectively operate to run one or more databases for one or more customers 1004. The customer 1004 may operate and manage a database from the database service by utilizing appropriately configured API calls. This, in turn, may allow a customer 1004 to maintain and potentially scale the operations in the database. Other services include, but are not limited to, object-level archival data storage services, services that manage and/or monitor other services.

The computing resource service provider 1002 further includes an archival storage service 1024. The archival storage service 1024 may comprise a collection of computing resources that collectively operate to provide storage for data archiving and backup of customer data. The data may comprise one or more data files that may be combined to form an archive. The archival storage service 1024 may be configured to persistently store data that may be infrequently accessed and for which long retrieval times are acceptable to a customer utilizing the archival storage service 1024. A customer may interact with the archival storage service 1024 (for example, through appropriately configured API calls made to the archival storage service 1024) to generate one or more archives, upload and retrieve the one or more archives or monitor the generation, upload or retrieval of the one or more archives.

The computing resource service provider 1002 additionally maintains one or more other services 1026 based at least in part on the needs of its customers 1004. For instance, the computing resource service provider 1002 may maintain a database service for its customers 1004. A database service may be a collection of computing resources that collectively operate to run one or more databases for one or more customers 1004. The customer 1004 may operate and manage a database from the database service by utilizing appropriately configured API calls. This, in turn, may allow a customer 1004 to maintain and potentially scale the operations in the database. Other services include, but are not limited to, object-level archival data storage services, services that manage and/or monitor other services.

Figure 11:
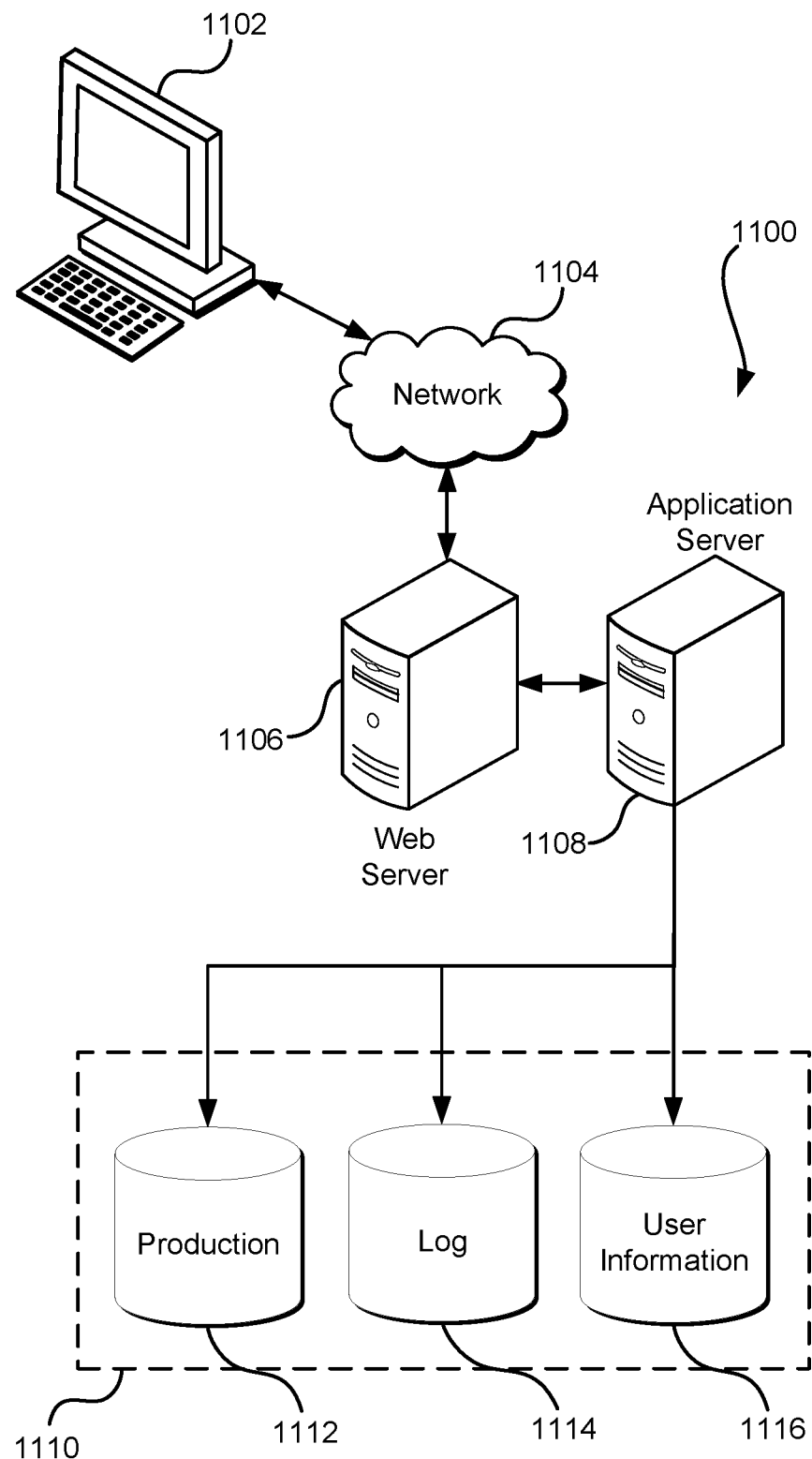
FIG. 11 illustrates a system in which various embodiments can be implemented.

FIG. 11 illustrates aspects of an example system 1100 for implementing aspects in accordance with an embodiment. As will be appreciated, although a web-based system is used for purposes of explanation, different systems may be used, as appropriate, to implement various embodiments. In an embodiment, the system includes an electronic client device 1102, which includes any appropriate device operable to send and/or receive requests, messages, or information over an appropriate network 1104 and convey information back to a user of the device. Examples of such client devices include personal computers, cellular or other mobile phones, handheld messaging devices, laptop computers, tablet computers, set-top boxes, personal data assistants, embedded computer systems, electronic book readers, and the like. In an embodiment, the network includes any appropriate network, including an intranet, the Internet, a cellular network, a local area network, a satellite network or any other such network and/or combination thereof and components used for such a system depend at least in part upon the type of network and/or system selected. Many protocols and components for communicating via such a network are well known and will not be discussed herein in detail. In an embodiment, communication over the network is enabled by wired and/or wireless connections and combinations thereof. In an embodiment, the network includes the Internet and/or other publicly-addressable communications network, as the system includes a web server 1106 for receiving requests and serving content in response thereto, although for other networks an alternative device serving a similar purpose could be used as would be apparent to one of ordinary skill in the art.

In an embodiment, the illustrative system includes at least one application server 1108 and a data store 1110 and it should be understood that there can be several application servers, layers or other elements, processes or components, which may be chained or otherwise configured, which can interact to perform tasks such as obtaining data from an appropriate data store. Servers, in an embodiment, are implemented as hardware devices, virtual computer systems, programming modules being executed on a computer system, and/or other devices configured with hardware and/or software to receive and respond to communications (e.g., web service application programming interface (API) requests) over a network. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered system. Data stores, in an embodiment, communicate with block-level and/or object level interfaces. The application server can include any appropriate hardware, software and firmware for integrating with the data store as needed to execute aspects of one or more applications for the client device, handling some or all of the data access and business logic for an application.

In an embodiment, the application server provides access control services in cooperation with the data store and generates content including, but not limited to, text, graphics, audio, video and/or other content that is provided to a user associated with the client device by the web server in the form of HyperText Markup Language ("HTML"), Extensible Markup Language ("XML"), JavaScript, Cascading Style Sheets ("CSS"), JavaScript Object Notation (JSON), and/or another appropriate client-side or other structured language. Content transferred to a client device, in an embodiment, is processed by the client device to provide the content in one or more forms including, but not limited to, forms that are perceptible to the user audibly, visually and/or through other senses. The handling of all requests and responses, as well as the delivery of content between the client device 1102 and the application server 1108, in an embodiment, is handled by the web server using PHP: Hypertext Preprocessor ("PHP"), Python, Ruby, Perl, Java, HTML, XML, JSON, and/or another appropriate server-side structured language in this example. In an embodiment, operations described herein as being performed by a single device are performed collectively by multiple devices that form a distributed and/or virtual system.

The data store 1110, in an embodiment, includes several separate data tables, databases, data documents, dynamic data storage schemes and/or other data storage mechanisms and media for storing data relating to a particular aspect of the present disclosure. In an embodiment, the data store illustrated includes mechanisms for storing production data 1112 and user information 1116, which are used to serve content for the production side. The data store also is shown to include a mechanism for storing log data 1114, which is used, in an embodiment, for reporting, computing resource management, analysis or other such purposes. In an embodiment, other aspects such as page image information and access rights information (e.g., access control policies or other encodings of permissions) are stored in the data store in any of the above listed mechanisms as appropriate or in additional mechanisms in the data store 1110.

The data store 1110, in an embodiment, is operable, through logic associated therewith, to receive instructions from the application server 1108 and obtain, update or otherwise process data in response thereto and the application server 1108 provides static, dynamic, or a combination of static and dynamic data in response to the received instructions. In an embodiment, dynamic data, such as data used in web logs (blogs), shopping applications, news services, and other such applications are generated by server-side structured languages as described herein or are provided by a content management system ("CMS") operating on, or under the control of, the application server. In an embodiment, a user, through a device operated by the user, submits a search request for a certain type of item. In this example, the data store accesses the user information to verify the identity of the user, accesses the catalog detail information to obtain information about items of that type, and returns the information to the user, such as in a results listing on a web page that the user views via a browser on the user device 1102. Continuing with example, information for a particular item of interest is viewed in a dedicated page or window of the browser. It should be noted, however, that embodiments of the present disclosure are not necessarily limited to the context of web pages, but are more generally applicable to processing requests in general, where the requests are not necessarily requests for content. Example requests include requests to manage and/or interact with computing resources hosted by the system 1100 and/or another system, such as for launching, terminating, deleting, modifying, reading, and/or otherwise accessing such computing resources.

In an embodiment, each server typically includes an operating system that provides executable program instructions for the general administration and operation of that server and includes a computer-readable storage medium (e.g., a hard disk, random access memory, read only memory, etc.) storing instructions that, if executed (i.e., as a result of being executed) by a processor of the server, cause or otherwise allow the server to perform its intended functions.

The system 1100, in an embodiment, is a distributed and/or virtual computing system utilizing several computer systems and components that are interconnected via communication links (e.g., transmission control protocol (TCP) connections and/or transport layer security (TLS) or other cryptographically protected communication sessions), using one or more computer networks or direct connections. However, it will be appreciated by those of ordinary skill in the art that such a system could operate in a system having fewer or a greater number of components than are illustrated in FIG. 11. Thus, the depiction of the system 1100 in FIG. 11 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. In an embodiment, user or client devices include any of a number of computers, such as desktop, laptop or tablet computers running a standard operating system, as well as cellular (mobile), wireless and handheld devices running mobile software and capable of supporting a number of networking and messaging protocols and such a system also includes a number of workstations running any of a variety of commercially-available operating systems and other known applications for purposes such as development and database management. In an embodiment, these devices also include other electronic devices, such as dummy terminals, thin-clients, gaming systems and other devices capable of communicating via a network, and virtual devices such as virtual machines, hypervisors, software containers utilizing operating-system level virtualization and other virtual devices or non-virtual devices supporting virtualization capable of communicating via a network.

In an embodiment, a system utilizes at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and other protocols. The network, in an embodiment, is a local area network, a wide-area network, a virtual private network, the Internet, an intranet, an extranet, a public switched telephone network, an infrared network, a wireless network, a satellite network, and any combination thereof. In an embodiment, a connection-oriented protocol is used to communicate between network endpoints such that the connection-oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In an embodiment, the system utilizes a web server that run one or more of a variety of server or mid-tier applications, including Hypertext Transfer Protocol ("HTTP") servers, FTP servers, Common Gateway Interface ("CGI") servers, data servers, Java servers, Apache servers, and business application servers. In an embodiment, the one or more servers are also capable of executing programs or scripts in response to requests from user devices, such as by executing one or more web applications that are implemented as one or more scripts or programs written in any programming language, such as Java®, C, C# or C++, or any scripting language, such as Ruby, PHP, Perl, Python or TCL, as well as combinations thereof. In an embodiment, the one or more servers also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. In an embodiment, a database server includes table-based servers, document-based servers, unstructured servers, relational servers, non-relational servers, or combinations of these and/or other database servers.

In an embodiment, the system includes a variety of data stores and other memory and storage media as discussed above which can reside in a variety of locations, such as on a storage medium local to (and/or resident in) one or more of the computers or remote from any or all of the computers across the network. In an embodiment, the information resides in a storage-area network ("SAN") familiar to those skilled in the art and, similarly, any necessary files for performing the functions attributed to the computers, servers or other network devices are stored locally and/or remotely, as appropriate. In an embodiment where a system includes computerized devices, each such device can include hardware elements that are electrically coupled via a bus, the elements including, for example, at least one central processing unit ("CPU" or "processor"), at least one input device (e.g., a mouse, keyboard, controller, touch screen, or keypad), at least one output device (e.g., a display device, printer, or speaker), at least one storage device such as disk drives, optical storage devices, and solid-state storage devices such as random access memory ("RAM") or read-only memory ("ROM"), as well as removable media devices, memory cards, flash cards, etc., and various combinations thereof.

In an embodiment, such a device also includes a computer-readable storage media reader, a communications device (e.g., a modem, a network card (wireless or wired), an infrared communication device, etc.), and working memory as described above where the computer-readable storage media reader is connected with, or configured to receive, a computer-readable storage medium, representing remote, local, fixed, and/or removable storage devices as well as storage media for temporarily and/or more permanently containing, storing, transmitting, and retrieving computer-readable information. In an embodiment, the system and various devices also typically include a number of software applications, modules, services, or other elements located within at least one working memory device, including an operating system and application programs, such as a client application or web browser. In an embodiment, customized hardware is used and/or particular elements are implemented in hardware, software (including portable software, such as applets), or both. In an embodiment, connections to other computing devices such as network input/output devices are employed.

In an embodiment, storage media and computer readable media for containing code, or portions of code, include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood with the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two, but can be more when so indicated either explicitly or by context.

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, a non-transitory computer-readable storage medium store instructions and a main CPU execute some of the instructions while a graphics processor unit executes other instructions. In an embodiment, different components of a computer system have separate processors and different processors execute different subsets of the instructions.

Accordingly, in an embodiment, computer systems are configured to implement one or more services that singly or collectively perform operations of processes described herein and such computer systems are configured with applicable hardware and/or software that enable the performance of the operations. Further, a computer system that implement an embodiment of the present disclosure is a single device and, in another embodiment, is a distributed computer systems comprising multiple devices that operate differently such that the distributed computer system performs the operations described herein and such that a single device does not perform all operations.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A system, comprising:
   a plurality of storage nodes; and
   at least one processor;
   a memory having stored thereon processor-executable instructions that, in response to being executed by the at least one processor, cause the system to at least:
   store a dataset on the plurality of storage nodes according to a first encoding in which the dataset is stored as n shards, wherein the n shards comprise at least a quorum of k shards stored on k of the plurality of storage nodes;
   determine to store the dataset according to a second encoding, wherein the dataset is stored according to the second encoding using fewer than n shards and quorum comprises less than k shards; and
   reconfigure the plurality of storage nodes to store the dataset according to the second encoding, wherein at least one of the storage nodes is dropped by the reconfiguration, and wherein a subset of a shard stored on the dropped node is copied to another node without re-encoding.

2. The system of claim 1, wherein the second encoding is selected based at least in part on storage efficiency criteria.

3. The system of claim 1, wherein the second encoding is selected based at least in part on resiliency criteria.

4. The system of claim 1, wherein the reconfigured plurality of storage nodes comprises less than n storage nodes.

5. The system of claim 1, wherein the k shards are identity shards.

6. A method, comprising:
   storing a dataset according to a first encoding in which the dataset is stored as a plurality of shards on a plurality of storage nodes;
   selecting a second encoding for storing the dataset, the second encoding comprising fewer shards than the first encoding; and
   reconfiguring the plurality of storage nodes to store the dataset according to the second encoding, wherein one of a plurality of portions of a shard of the first encoding is combined, without re-encoding, with a shard of the second encoding.

7. The method of claim 6, further comprising:
   splitting the shard of the first encoding into the plurality of portions;
   combining the plurality of portions with shards of the second encoding; and
   dropping the shard of the first encoding.

8. The method of claim 6, wherein the second encoding is selected based at least in part on storage efficiency criteria.

9. The method of claim 6, wherein the second encoding is selected based at least in part on a reduction in a requirement for resiliency to data loss.

10. The method of claim 6, wherein the shard of the second encoding comprises at least one portion that was not copied from another node by the reconfiguring.

11. The method of claim 6, wherein the second encoding comprises re-encoded data, the re-encoded data based on access to less than all of the plurality of storage nodes.

12. The method of claim 6, wherein the shard of the second encoding is generated based on access to less than all of the plurality of storage nodes.

13. The method of claim 6, further comprising:
selecting the second encoding based at least in part on a ratio of shards needed for quorum in the first encoding to shards needed for quorum in the second encoding.

14. A non-transitory computer-readable storage medium having stored thereon executable instructions that, as a result of being executed by one or more processors of a computer system, cause the computer system to at least:
store a dataset on a plurality of storage nodes according to a first encoding comprising a plurality of shards stored on a plurality of storage nodes;
select a second encoding for the dataset, based at least in part on the second encoding comprising fewer shards than the first encoding; and
store the dataset on the plurality of storage nodes according to the second encoding, wherein a shard of the first encoding is dropped and a portion of the dropped shard is combined with another shard without re-encoding.

15. The non-transitory computer-readable storage medium of claim 14, wherein the second encoding is selected in response to a request to alter at least one of a performance or resiliency characteristic.

16. The non-transitory computer-readable storage medium of claim 14, wherein the second encoding is selected in response to a change to at least one of storage efficiency criteria or resiliency criteria.

17. The non-transitory computer-readable storage medium of claim 14, wherein the instructions further comprise instructions that, as a result of being executed by the one or more processors, cause the computer system to reconfigure operation of the plurality of storage nodes to store the dataset according to the second encoding.

18. The non-transitory computer-readable storage medium of claim 17, wherein the instructions further comprise instructions that, as a result of being executed by the one or more processors, cause the computer system to select one or more of the plurality of storage nodes to exclude from the reconfigured plurality of storage nodes.

19. The non-transitory computer-readable storage medium of claim 17, wherein reconfiguring operation of the plurality of storage nodes comprises re-routing data retrieval operations in accordance with the second encoding.

20. The non-transitory computer-readable storage medium of claim 14, wherein a shard of the second encoding is re-encoded based on a subset of the plurality of shards.

* * * * *